United States Patent
Shim

(10) Patent No.: US 8,612,041 B2
(45) Date of Patent: Dec. 17, 2013

(54) METHOD FOR OPTIMIZING COMPONENT MOUNTING SEQUENCE WITH VARIABLE PITCH HEADS AND COMPONENT MOUNTING DEVICE USING THE SAME

(75) Inventor: Yo-Sung Shim, Changwon-si (KR)

(73) Assignee: Samsung Techwin Co., Ltd., Changwon-si (KR)

( * ) Notice: Subject to any disclaimer, the term of this patent is extended or adjusted under 35 U.S.C. 154(b) by 355 days.

(21) Appl. No.: 13/167,784

(22) Filed: Jun. 24, 2011

(65) Prior Publication Data

US 2012/0123575 A1    May 17, 2012

(30) Foreign Application Priority Data

Nov. 12, 2010 (KR) .................. 10-2010-0112689

(51) Int. Cl.
*G06F 19/00* (2011.01)

(52) U.S. Cl.
USPC ............ 700/100; 700/101; 700/117; 29/739; 29/740; 29/840

(58) Field of Classification Search
USPC ............ 700/100, 101, 117; 29/739, 740, 840
See application file for complete search history.

(56) References Cited

U.S. PATENT DOCUMENTS

| | | | | |
|---|---|---|---|---|
| 6,650,953 B2 * | 11/2003 | Schaffer et al. | ............... | 700/103 |
| 6,862,803 B2 * | 3/2005 | Kawase et al. | ............... | 29/832 |
| 6,971,161 B1 * | 12/2005 | Maenishi et al. | ............... | 29/832 |
| 6,996,440 B2 * | 2/2006 | Maenishi et al. | ............... | 700/28 |
| 7,133,731 B2 * | 11/2006 | Yamazaki et al. | ............... | 700/95 |
| 7,142,939 B2 * | 11/2006 | Nonaka et al. | ............... | 700/121 |
| 7,395,129 B2 * | 7/2008 | Yamazaki et al. | ............... | 700/104 |
| 7,536,236 B2 * | 5/2009 | Yano et al. | ............... | 700/121 |
| 7,603,193 B2 * | 10/2009 | Maenishi et al. | ............... | 700/100 |
| 7,885,718 B2 * | 2/2011 | Yano et al. | ............... | 700/65 |
| 7,899,561 B2 * | 3/2011 | Maenishi et al. | ............... | 700/28 |
| 8,086,338 B2 * | 12/2011 | Yano et al. | ............... | 700/108 |

(Continued)

FOREIGN PATENT DOCUMENTS

| | | |
|---|---|---|
| JP | 8-167796 A | 6/1996 |
| KR | 10-0179890 B1 | 11/1998 |

(Continued)

OTHER PUBLICATIONS

"Scheduling Optimization of Component Mounting in Printed Circuit Board Assembly by Prioritizing Simultaneous Pickup", T. Tsuchiya et al, 2007.*

*Primary Examiner* — Michael D Masinick
(74) *Attorney, Agent, or Firm* — Sughrue Mion, PLLC

(57) ABSTRACT

A method is provided for determining a sequence of mounting a plurality of components on a board by using variable pitch heads having a plurality of pitches. The method includes: partitioning the board into a plurality of sectors, each of the sectors including a plurality of mounting points arranged in parallel with a direction in which the heads are arranged; dividing the board into a plurality of sub-boards including first sub-boards based on the sectors, each of the first sub-boards including as many mounting points as the heads; and determining a combination of a sequence of mounting the components on the board and at least one pitch among the pitches required to mount the components on the board in a shortest time, compared to another sequence or other sequences of mounting the components on the board and another pitch or other pitches among the pitches, based on the first sub-boards.

26 Claims, 20 Drawing Sheets

TRANSFER AXIS (X-AXIS)

(56) References Cited

U.S. PATENT DOCUMENTS

| | | | |
|---|---|---|---|
| 2004/0073322 A1* | 4/2004 | Maenishi et al. | 700/28 |
| 2005/0288806 A1* | 12/2005 | Yamazaki et al. | 700/95 |
| 2006/0052893 A1* | 3/2006 | Yamazaki et al. | 700/100 |
| 2006/0229758 A1* | 10/2006 | Maenishi et al. | 700/121 |
| 2007/0293969 A1* | 12/2007 | Hirai et al. | 700/114 |
| 2008/0154392 A1* | 6/2008 | Maenishi et al. | 700/32 |
| 2009/0000110 A1* | 1/2009 | Maenishi | 29/743 |
| 2009/0043413 A1* | 2/2009 | Yano et al. | 700/95 |
| 2009/0259333 A1* | 10/2009 | Yano et al. | 700/121 |
| 2012/0123575 A1* | 5/2012 | Shim | 700/97 |

FOREIGN PATENT DOCUMENTS

| | | |
|---|---|---|
| KR | 10-0192054 B1 | 1/1999 |
| KR | 10-0365635 B1 | 12/2002 |
| KR | 10-2006-0015450 A | 2/2006 |
| KR | 10-0585599 B1 | 5/2006 |
| KR | 10-2007-0011603 A | 1/2007 |
| KR | 10-0850596 B1 | 7/2008 |

* cited by examiner

TRANSFER AXIS (X-AXIS)

METHOD FOR OPTIMIZING COMPONENT MOUNTING SEQUENCE WITH VARIABLE PITCH HEADS AND COMPONENT MOUNTING DEVICE USING THE SAME

CROSS-REFERENCE TO RELATED APPLICATION

This application claims priority from Korean Patent Application No. 10-2010-0112689 filed on Nov. 12, 2010 in the Korean Intellectual Property Office, the disclosure of which is incorporated herein by reference in its entirety.

BACKGROUND

1. Field

Methods and apparatuses consistent with exemplary embodiments relate to optimizing a component mounting sequence with variable pitch heads.

2. Description of the Related Art

Fixed pitch heads or variable pitch heads are used in a component mounting device that mounts components on a board. An optimized mounting method in which components are mounted in a short period of time using fixed pitch heads has been used. However, a component mounting device using the fixed pitch heads is disadvantageous in that it cannot be generally used for boards having a variable component mounting interval although it may be readily applied to boards having a fixed component mounting interval.

To address this drawback, a component mounting device having variable pitch heads has been proposed to be variably applied to boards having a variable component mounting interval. In practice, it is important how a pitch and a mounting sequence of variable pitch heads are determined in terms of a product yield. Notwithstanding, little research into generalized and optimized methods of determining the pitch and mounting sequence of variable pitch heads has been conducted on multiple boards having various component mounting intervals.

SUMMARY

One or more exemplary embodiments provide a method for optimizing a component mounting sequence with variable pitch heads, which can be flexibly adapted to distribution of various component mounting points.

One or more exemplary embodiments also provide a component mounting device using a method for optimizing a component mounting sequence with variable pitch heads, which can be flexibly adapted to distribution of various component mounting points.

Various aspects of one or more exemplary embodiments will be described in or be apparent from the following description.

According to an aspect of an exemplary embodiment, there is provided a method of determining a sequence of mounting a plurality of components on a board by using a plurality of variable pitch heads having a plurality of pitches, the method including partitioning the board into a plurality of sectors each of the sectors including a plurality of mounting points arranged in parallel with a direction in which the heads are arranged, dividing the board into a plurality of sub-boards including first sub-boards based on the sectors, each of the first sub-boards including as many mounting points as the heads, and determining a combination of a sequence of mounting the components on the board and at least one pitch among the pitches required to mount the components on the board in a shortest time, compared to another sequence or other sequences of mounting the components on the board and another pitch or other pitches among the pitches, based on the first sub-boards.

According to an aspect of another exemplary embodiment, there is provided a device for mounting a plurality of components on a board in a computerized manner, the device including a transferring unit including a plurality of variable pitch heads having a plurality of pitches, and a controller which partitions the board into a plurality of sectors each of the sectors including a plurality of mounting points arranged in parallel with a direction in which the heads are arranged, divides the board into a plurality of sub-boards including first sub-boards based on the sectors, each of the first sub-boards including as many mounting points as the heads, and determines a combination of a sequence of mounting the components on the board and at least one pitch among the pitches required to mount the components on the board in a shortest time, compared to another sequence or other sequences of mounting the components on the board and another pitch or other pitches among the pitches, based on the first sub-boards.

BRIEF DESCRIPTION OF THE DRAWINGS

The above and other aspects will become more apparent by describing in detail exemplary embodiments with reference to the attached drawings, in which.

DETAILED DESCRIPTION OF EXEMPLARY EMBODIMENTS

Figure 1:
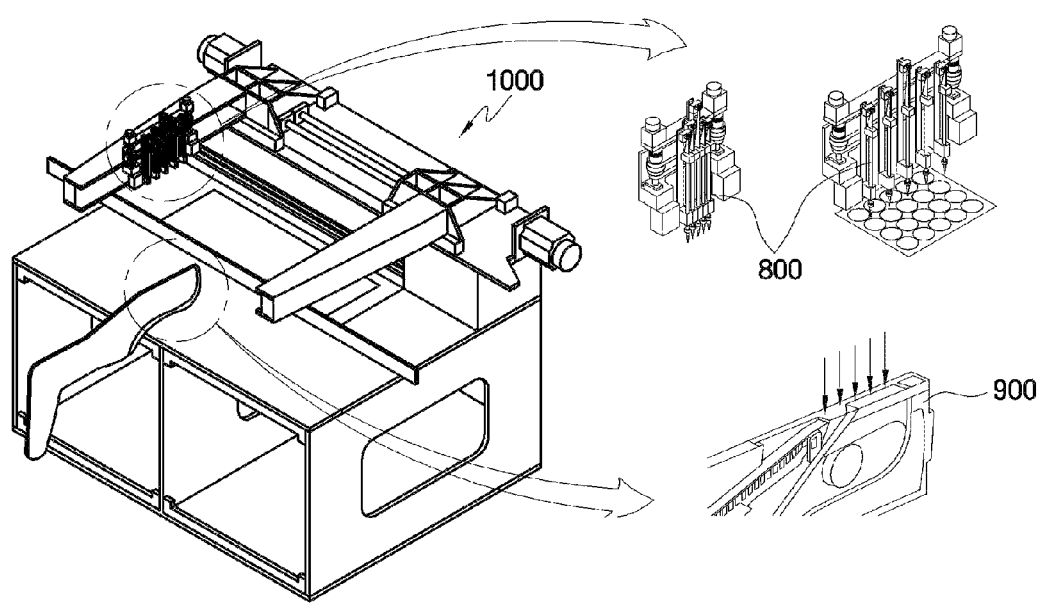
FIG. 1 is a perspective view illustrating a component mounting device, a component feeder, and that variable heads pitch are simultaneously mounted and adsorbed, according to an exemplary embodiment.

Advantages and features of the inventive concept may be understood more readily by reference to the following detailed description of exemplary embodiments and the accompanying drawings. The inventive concept may, however, be embodied in many different forms and should not be construed as being limited to the exemplary embodiments set forth herein. Rather, these exemplary embodiments are provided so that this disclosure will be thorough and complete and will fully convey the concept of the inventive concept to those skilled in the art, and the inventive concept will only be defined by the appended claims. Like numbers refer to like elements throughout.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concept.

The terminology used herein is for the purpose of describing particular exemplary embodiments only and is not intended to limit the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated components, but do not preclude the presence or addition of one or more other components.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

FIG. 1 is a perspective view illustrating a component mounting device, a component feeder, and that variable pitch heads are simultaneously mounted and adsorbed, according to an exemplary embodiment.

Referring to FIG. 1, a component mounting device 1000 performs a mounting operation of components such as semiconductor chips on a board. To perform the mounting operation, a component feeder 900 for supplying components is installed. A loader, such as a gantry, having a set of variable pitch heads 800 is provided to adsorb components from the component feeder 900 and to mount the adsorbed components on a board. The heads 800 simultaneously adsorb the components and simultaneously mount the components. In other exemplary embodiments, the heads 800 may mount components independently.

Figure 2:
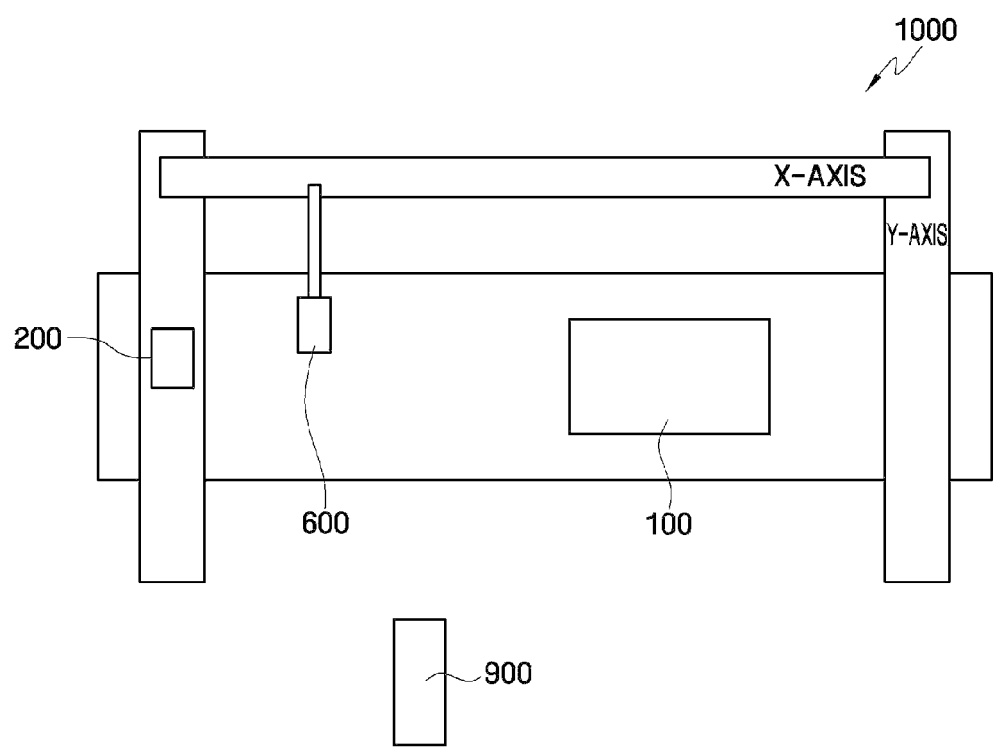
FIG. 2 is a plan view of a component mounting device according to an exemplary embodiment.

FIG. 2 is a plan view of a component mounting device, according to an exemplary embodiment.

Referring to FIG. 2, the component mounting device 1000 includes a conveyor belt, variable pitch heads 800, a loader 600, an X-Y orthogonal robot, a component recognizing unit and a component feeder 900. The component mounting device 100 also includes a controller 200 which controls overall operations of the variable pitch heads provided in the loader 600.

The conveyor belt transfers a board 100 to an operation area. When an operation of mounting components on the transferred board 100 is finished, the finished board 100 is transferred from the operation area. Here, the board 100 may include a variety of boards, including a board used as an illuminating light emitting diode (LED) board, a board used as an LED board for a back light unit (BLU), a widthwise arrayed board, a lengthwise arrayed board, and a printed circuit board (PCB) having a length of not less than 600 mm.

The variable pitch heads 800 serve to adsorb components. Unlike fixed pitch heads, the variable pitch heads 800 include a motor installed in the loader 600 that is a set of heads 800 and may change a pitch that is a distance between heads by driving the motor. In the illustrated exemplary embodiment, the loader 600 is configured to have a single motor installed therein. That is to say, the pitch that is a distance between heads is constantly maintained. However, it is also possible to adjust a variable pitch between heads, for example, by installing additional motors in the loader 600, according to an exemplary embodiment.

Each of the heads 800 includes a nozzle which adsorbs a component by producing a vacuum. Different types of nozzles are used according to an external shape or size of a component, presence or absence of lead, a pitch of leads, and a mounting accuracy requirement. In addition, an angle adjusting motor that is a device for rotating a nozzle by a predetermined angle according to a mounting angle may be installed in the head.

The loader 600 includes a set of variable pitch heads 800. For convenience of explanation, in the present exemplary embodiment, the loader 600 includes five (5) variable pitch heads 800, but the number of variable pitch heads 800 included in the loader 600 is not limited to five.

As shown, the X-Y orthogonal robot includes X- and Y-axis frames. The X-Y orthogonal robot moves the loader 600 connected to the X-axis frame in X-axis and Y-axis directions, thereby allowing the heads 800 to move to all positions above or on the board 100. However, the positional relationship between the loader 600 and the frame is not limited to that illustrated herein.

The component recognizing unit includes a reflecting mirror and a recognizing camera. The component recognizing unit determines an adsorbed state of a component, an adsorption angle, and whether the adsorbed component is a pertinent component by recognizing an image of the component mirrored on the reflecting mirror using the recognizing camera.

The component feeder 900 supplies components to be mounted on mounting points on the board 100, and generally includes a component tape. The component tape is a tape on which a plurality of components of a same type are arranged. The component tape is supplied with a reel around which the tape is wound. The component tape may be used to supply relatively small components, such as chip components, to a mounting device. In addition, the components accommodated in the component feeder 900 are mounted at different pitches according to a kind of component. The smaller the component, the narrower the pitch between components.

Figure 3:
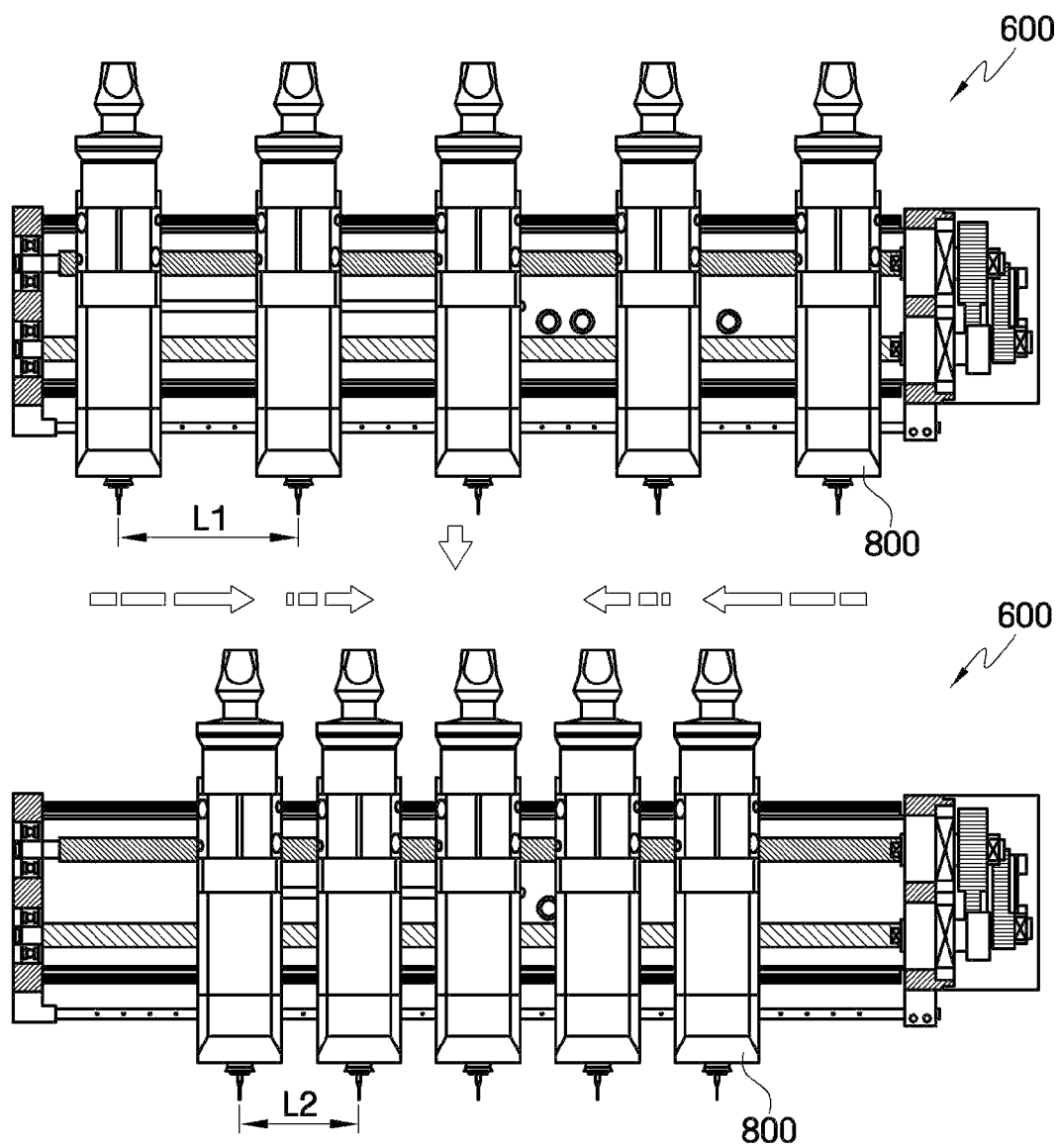
FIG. 3 is a cross-sectional view of variable pitch heads with a maximum pitch and a minimum pitch, according to an exemplary embodiment.

FIG. 3 is a cross-sectional view of variable pitch heads with a maximum pitch and a minimum pitch, according to an exemplary embodiment.

Referring to FIG. 3, the variable pitch heads 800 are set to a maximum pitch and a minimum pitch. For example, when the pitch of the variable pitch heads 800 is in a range of 12 mm to 30 mm, the maximum pitch L1 is 30 mm and the minimum pitch L2 is 12 mm. As described above, when only one motor is installed in the loader 600, all of the variable pitch heads 800 may have a same pitch.

Figure 4:
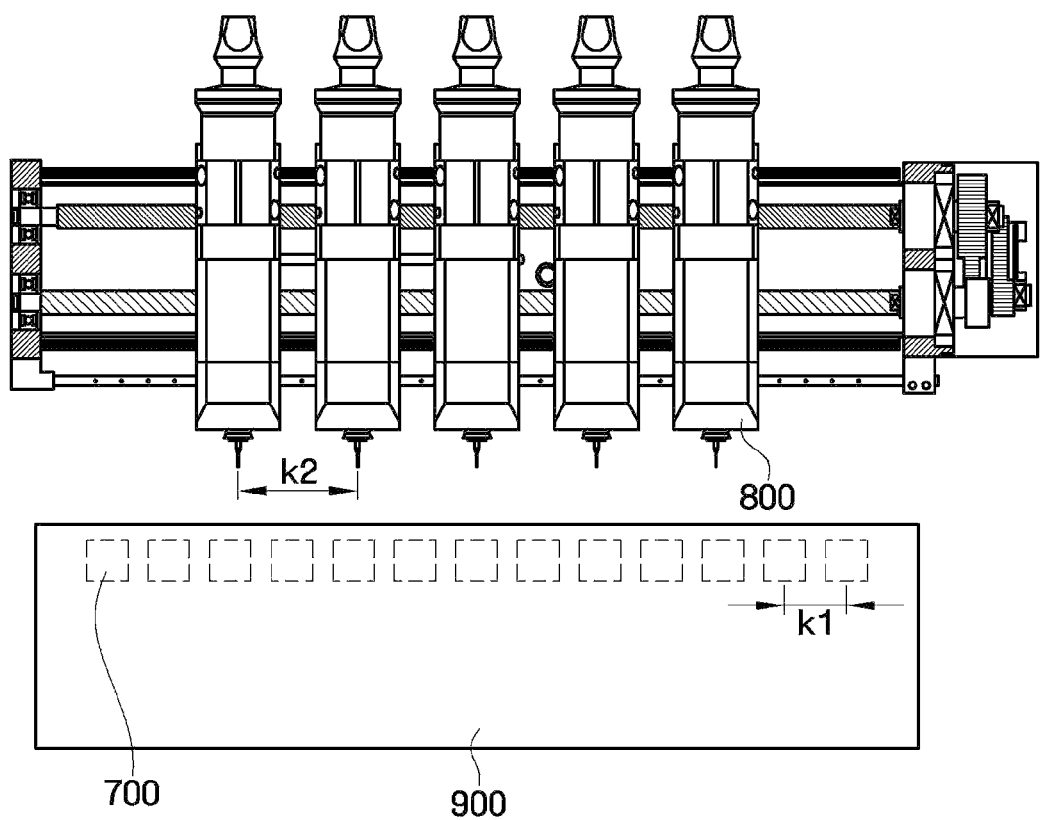
FIGS. 4 and 5 are cross-sectional views illustrating that components are simultaneously adsorbed, according to an exemplary embodiment.
Figure 5:
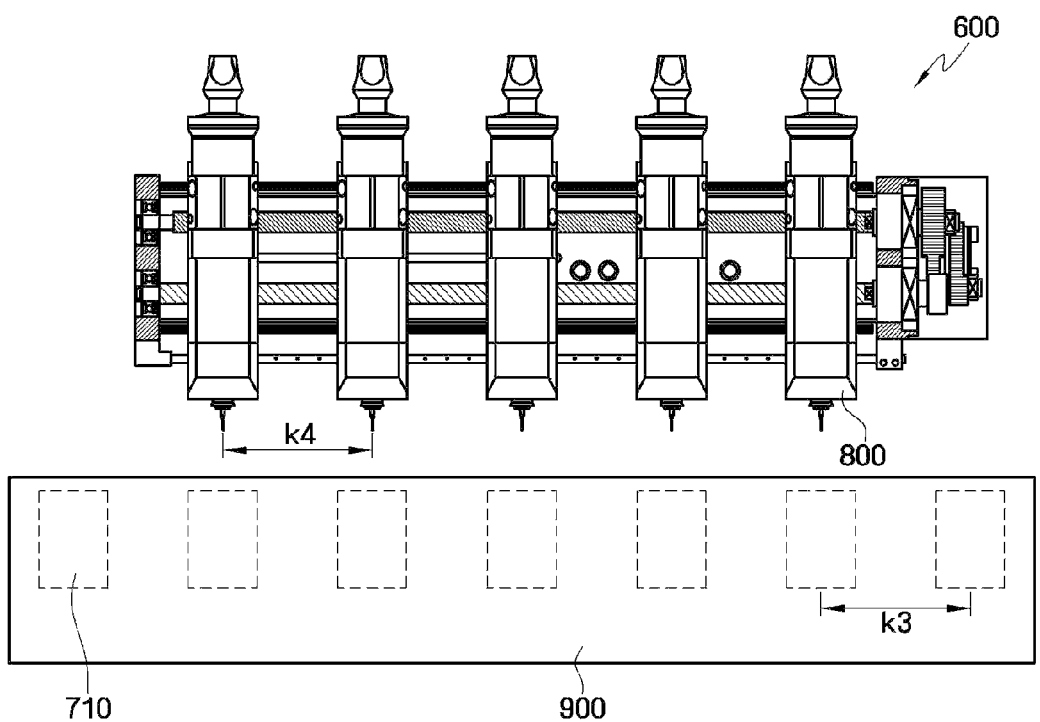

FIGS. 4 and 5 are cross-sectional views illustrating that components are simultaneously adsorbed, according to exemplary embodiments. In detail, FIG. 4 is a cross-sectional view illustrating that small components are simultaneously adsorbed, and FIG. 5 is a cross-sectional view illustrating that components larger than those shown in FIG. 5 are simultaneously adsorbed.

Referring to FIGS. 4 and 5, the variable pitch heads 800 maintain a predetermined pitch and adsorb components 700 and components 710 provided in the component feeder 900. An interval at which the components 700 and 710 are provided in the component feeder 900 may differ according to the kinds of the components 700 and 710. In addition, the smaller the components 700 and 710, the narrower the interval between the components 700 and 710. For example, the small components 700 are provided in the component feeder 900 at an interval of 8 mm. The medium/large components 710 may be provided in the component feeder 900 at an interval of 16 mm.

In order to simultaneously adsorb the components 700 and 710, the variable pitch heads 800 adjust a pitch. For example, as described above, the variable pitch heads 800 maintains a predetermined pitch. When the pitch is in a range of 12 mm to 30 mm, it is not possible to reduce the pitch to 8 mm in order to simultaneously adsorb the components 700 having a pitch k1 of 8 mm. Thus, the components 700 are simultaneously adsorbed with a pitch k2 of 16 mm while alternately skipping the components 700. When a pitch k3 between the components 710 is 24.5 mm, it is possible to set a pitch k4 to 24.5 mm. Thus, the components 710 can be simultaneously adsorbed without skipping the components 710. Therefore, according to the present exemplary embodiment, in order to simultaneously adsorb the components 700 and 710, the pitch of the variable pitch heads 800 is adjusted during adsorption of the components 700 and 710.

Figure 6:
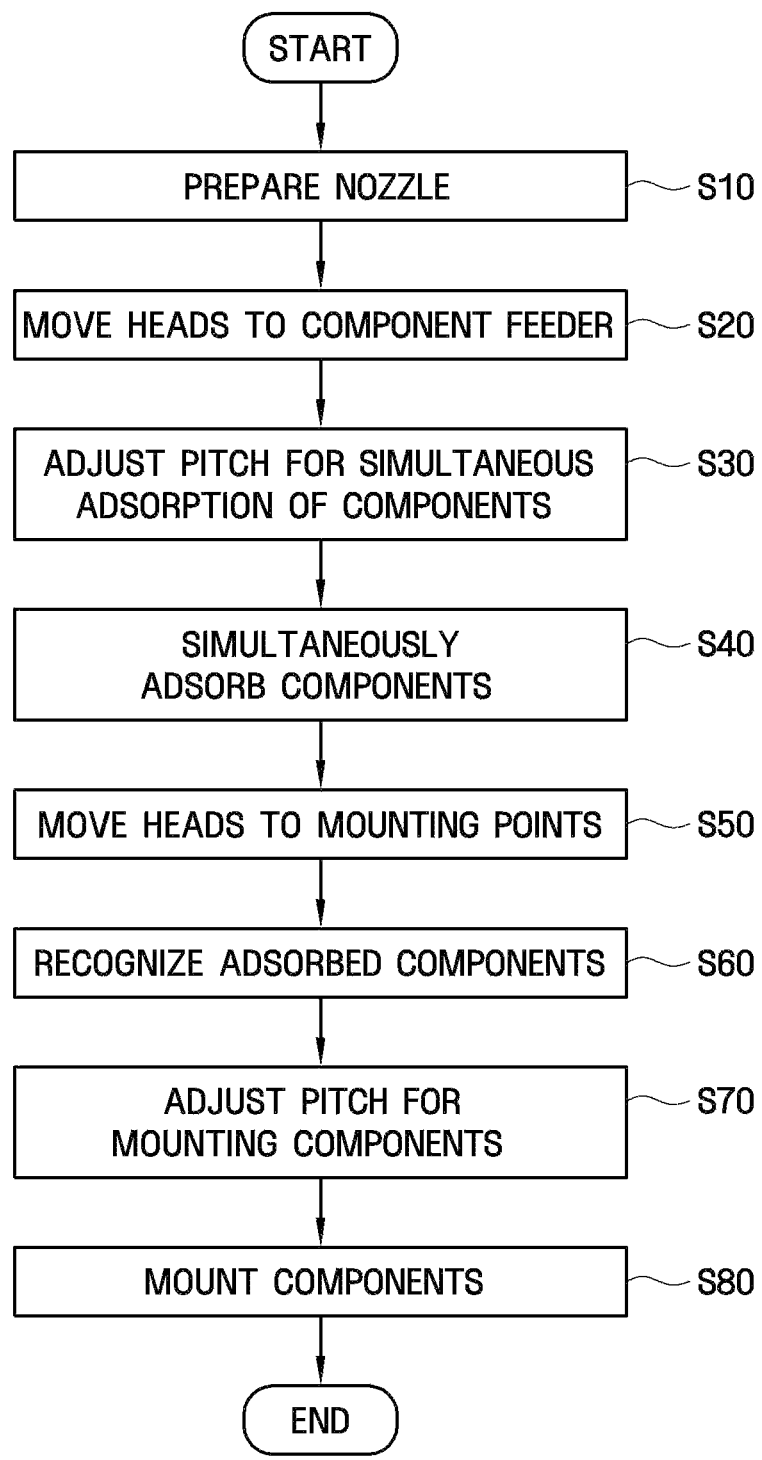
FIG. 6 is a flowchart illustrating cycles of adsorbing, recognizing and mounting components, according to an exemplary embodiment.

FIG. 6 is a flowchart illustrating a cycle of adsorbing, recognizing and mounting components.

Referring to FIG. 6, the pitch of the components 700 and 710 is adjusted for each cycle. The pitch may be adjusted for each model product, for example, the board 100, or whenever one of the components 700 or one of the components 710 is mounted at corresponding mounting points on the board 100. In a former case, however, the loader 600 may unnecessarily often move due to additional operations to be performed on the remaining mounting points that are irregularly distributed in a later stage of a mounting operation. In the latter case, an accuracy of the pitch may deteriorate by frequently moving the axis and frequently driving the motor, thereby lowering an operation accuracy. To address this aspect, the present exemplary embodiment is directed to pitch adjustment performed for each cycle.

One cycle may include preparing a nozzle (S10), moving the heads 800 to the component feeder 900 (S20), adjusting a pitch for adsorbing the components 700 or 710 (S30), simultaneously adsorbing the components 700 or 710 (S40), moving the heads 800 to mounting points (S50), recognizing the adsorbed components 700 or 710 (S60), adjusting a pitch for mounting the components 700 or 710 (S70), and the mounting components 700 or 710 (S80).

First, in consideration of a size of the components 700 or 710 and a kind of the heads 800, a pertinent nozzle is selected at a nozzle station (not shown in FIG. 2) (S10). Then, the heads 800 each having a nozzle is moved to the component feeder 900 (S20). Next, in order to simultaneously adsorb the components 700 or 710 provided in the component feeder 900, a pitch of the heads 800 is adjusted (S30).

As many of the components 700 or 710 as the heads 800 are simultaneously adsorbed using the heads 800 having the adjusted pitch (S40). Thereafter, the heads 800 are moved to mounting points on the board 100 (S50). Next, states of the adsorbed components 700 or 710 and whether the adsorbed components 700 or 710 are pertinent components are recognized by the recognizing camera of the component recognizing unit (S60). If there is no abnormality in the recognizing result, a pitch for mounting the components 700 or 710 is adjusted (S70).

Finally, the components 700 or 710 are simultaneously or independently mounted at the corresponding mounting points in a calculated mounting sequence (S80).

As stated above, according to the present exemplary embodiment, the mounting pitch may be varied after each cycle. That is, the mounting pitch is set for each cycle of mounting the components.

Figure 7:
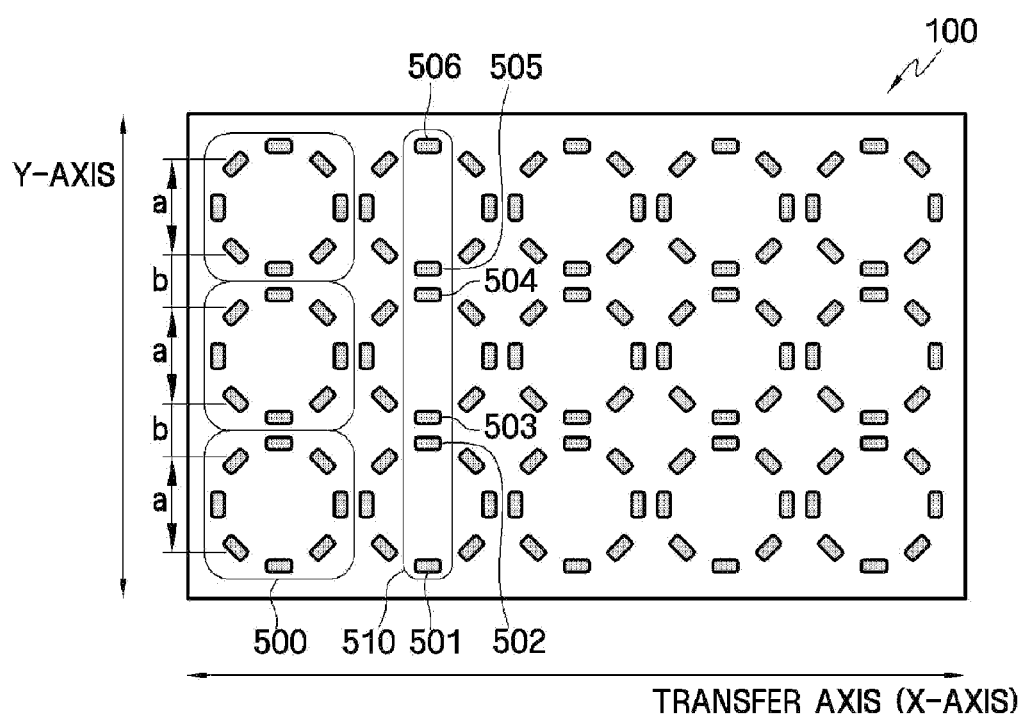
FIG. 7 illustrates pitch candidates according to an exemplary embodiment.

FIG. 7 illustrates pitch candidates according to an exemplary embodiment.

FIG. 7 illustrates a board 100, arrays 500, which are predetermined areas including mounting points in the board 100, and sectors. The arrays 500 refer to a pattern in which the same mounting points are arranged. A sector refer to a set of mounting points having the same coordinate value of an axis (i.e., the X-axis) perpendicular to a direction in which heads, such as the variable pitch heads 800 described above, are arranged. However, there may be a slight difference in the X coordinate of the mounting points included in the sectors, which will later be described again.

In order to derive an optimized method of mounting components, assuming that an axis parallel with the direction in which the heads are arranged is Y-axis, pitch candidates to be adopted to determine an optimized method may include any one of a Y offset value of the arrays 500, 1/n of the Y offset value of the arrays 500 (e.g., n=2, 3, 4, and 5, but not limited thereto), a median of Y coordinate differences between the mounting points within a sector, an average of Y coordinate differences between the mounting points within the sector, the most frequent value of Y coordinate differences between the mounting points within the sector, a preset minimum pitch of the heads and a preset maximum pitch of the heads.

The Y offset value of the arrays 500 refers to a Y-axis interval between the arrays 500. The Y-axis interval of the mounting points positioned corresponding to the respective arrays 500 becomes a+b. That is, the Y offset value of the arrays 500 is a+b.

The 1/n value of the Y offset value of the arrays 500 is (a+b)/n. When n=2, 3, 4, and 5, the 1/n values of the Y offset value of the arrays 500 are (a+b)/2, (a+b)/3, (a+b)/4, and (a+b)/5, respectively. However, the 1/n value of the Y offset value of the arrays 500 varies according to the value of n.

The median of Y coordinate differences between the mounting points within a sector refers to a median value in a case where the Y coordinate differences are arrayed in a row. For example, assuming that six (6) mounting points positioned in a sector 510 are coordinates (3, 0) of a first point 501, coordinates (3, 4) of a second point 502, coordinates (3, 5) of a third point 503, coordinates (3, 9) of a fourth point 504, coordinates (3, 10) of a fifth point 505, and coordinates (3, 14) of a sixth point 506, the Y coordinate differences are 4, 1, 4, 1, and 4. The Y coordinate differences arrayed in a row are 1, 1, 4, 4, and 4. Thus, the median of the Y coordinate differences is 4.

The average of Y coordinate differences between the mounting points within a sector refers to a calculated average value of the Y coordinate differences. For example, assuming that six (6) mounting points positioned in the sector 510 are coordinates (3, 0) of a first point 501, coordinates (3, 4) of a second point 502, coordinates (3, 5) of a third point 503, coordinates (3, 9) of a fourth point 504, coordinates (3, 10) of a fifth point 505, and coordinates (3, 14) of a sixth point 506, the Y coordinate differences are 4, 1, 4, 1, and 4, and the average of the Y coordinate differences becomes (4+1+4+1+4)/5=2.8.

The most frequent value of Y coordinate differences between the mounting points within a sector refers to a most frequently occurring value among the Y coordinate differences. For example, assuming that six (6) mounting points positioned in the sector 510 are coordinates (3, 0) of a first point 501, coordinates (3, 4) of a second point 502, coordinates (3, 5) of a third point 503, coordinates (3, 9) of a fourth point 504, coordinates (3, 10) of a fifth point 505, and coordinates (3, 14) of a sixth point 506, the Y coordinate differences are 4, 1, 4, 1, and 4, and the most frequent value of Y coordinate differences is 4.

The preset minimum pitch refers to the smallest pitch of the variable pitch heads 800. For example, when a pitch is in a range of 12 mm to 30 mm, the preset minimum pitch is 12 mm.

The preset maximum pitch refers to the largest pitch of the variable pitch heads 800. For example, when the pitch is in a range of 12 mm to 30 mm, the preset maximum pitch is 30 mm.

Thus, these values are applied to the pitch value in calculating the shortest mounting time, thereby obtaining an optimized component mounting method.

A process of determining a head pitch and a mounting sequence will now be described with reference to FIGS. 8 through 22.

Figure 8:
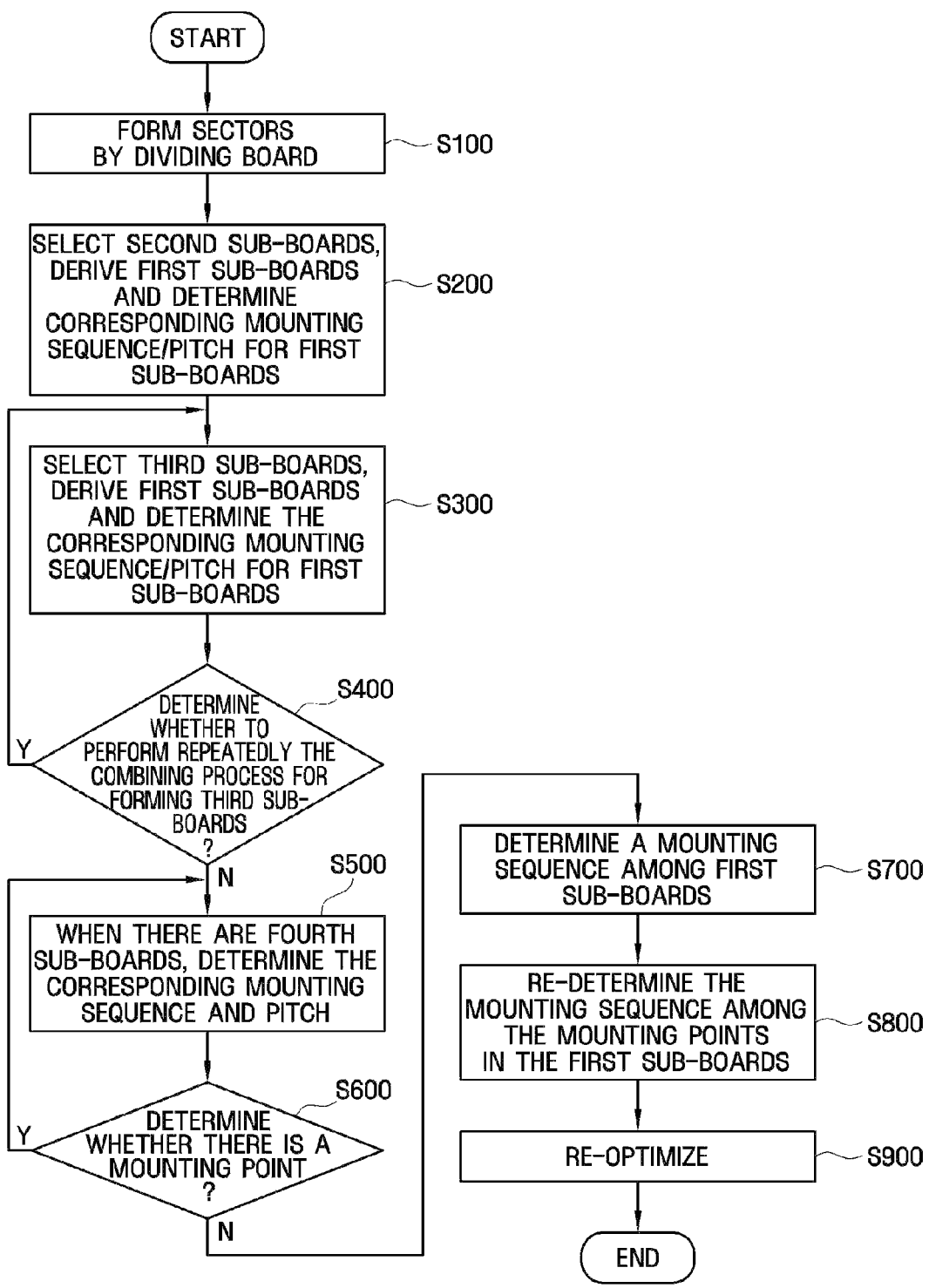
FIG. 8 is a flowchart of determining a head pitch and a mounting sequence according to an exemplary embodiment.

FIG. 8 is a flowchart of determining a head pitch and a mounting sequence, and FIGS. 9 through 22 illustrate a process of determining a head pitch and a mounting sequence.

Figure 9:
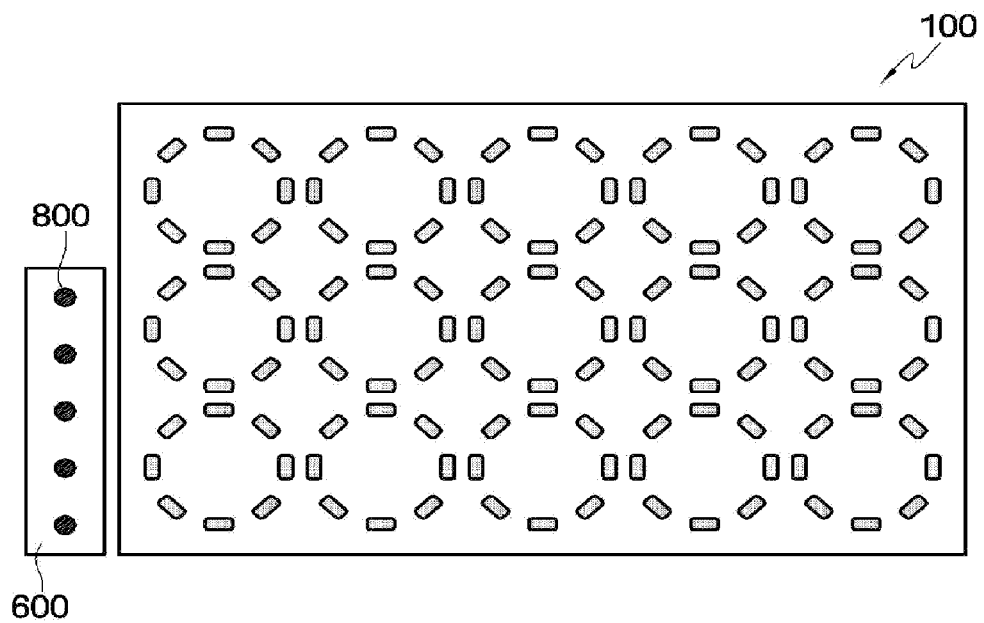
FIGS. 9 through 22 illustrate a process of determining a head pitch and a mounting sequence, according to an exemplary embodiment.
Figure 10:
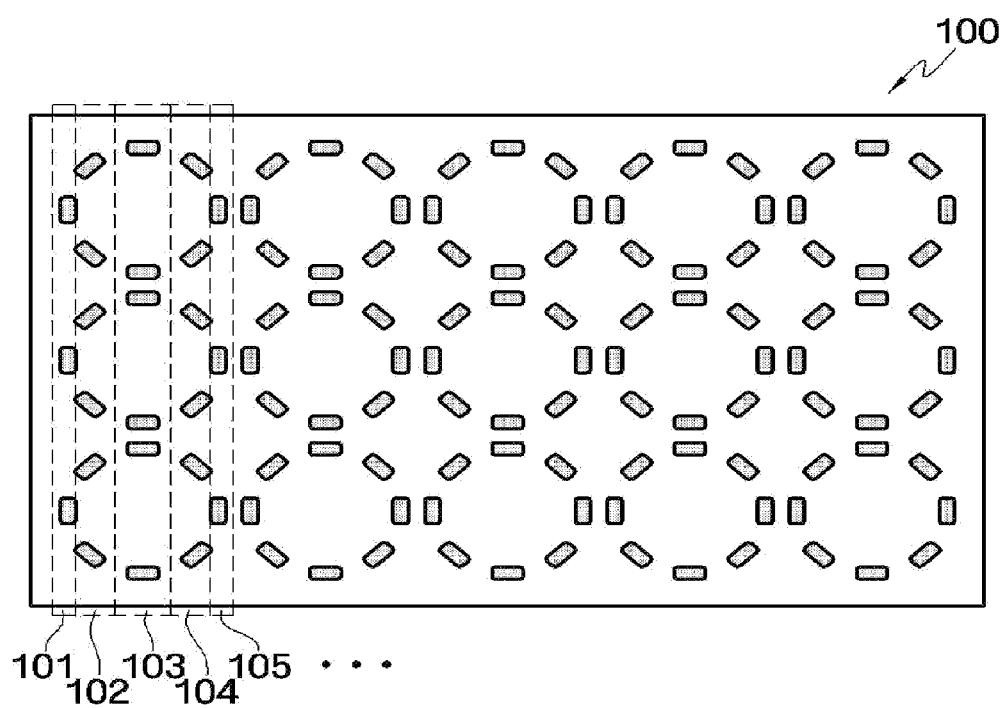

Referring to FIGS. 8, 9 and 10, a board 100 including a plurality of arrays 500 is partitioned to form a plurality of sectors (S100).

The board 100 including the arrays 500, which are patterns configured by same mounting points, is transferred to an operation space through a conveyor belt, and the loader 600 including a plurality of variable pitch heads 800 prepares for mounting. The board 100 transferred to the operation space is partitioned to include mounting points having a same X-axis (transfer axis) coordinate, thereby forming the plurality of sectors 101, 102, 103, 104, and 105 (FIG. 10). The board 100 is partially partitioned by dotted lines, which is, however, only for convenient illustration and the entire board 100 may be a target for partitioning. The board 100 is partitioned into the plurality of sectors 101, 102, 103, 104, and 105. Here, the board 100 is partitioned based on the axis perpendicular to the direction in which heads are arranged. For convenience of explanation, partitioning of the board 100 based on the X-axis will be described as an example.

Referring to FIGS. 8, 11, 12, 13 and 19, second sub-boards 210, 220 and 230 including as many mounting points as or more mounting points than the heads 800 are selected, a mounting sequence and a pertinent pitch of the mounting points in first sub-boards 420, 430 and 440 (FIG. 11) derived from the second sub-boards 210, 220 and 230 are determined (S200).

Figure 11:
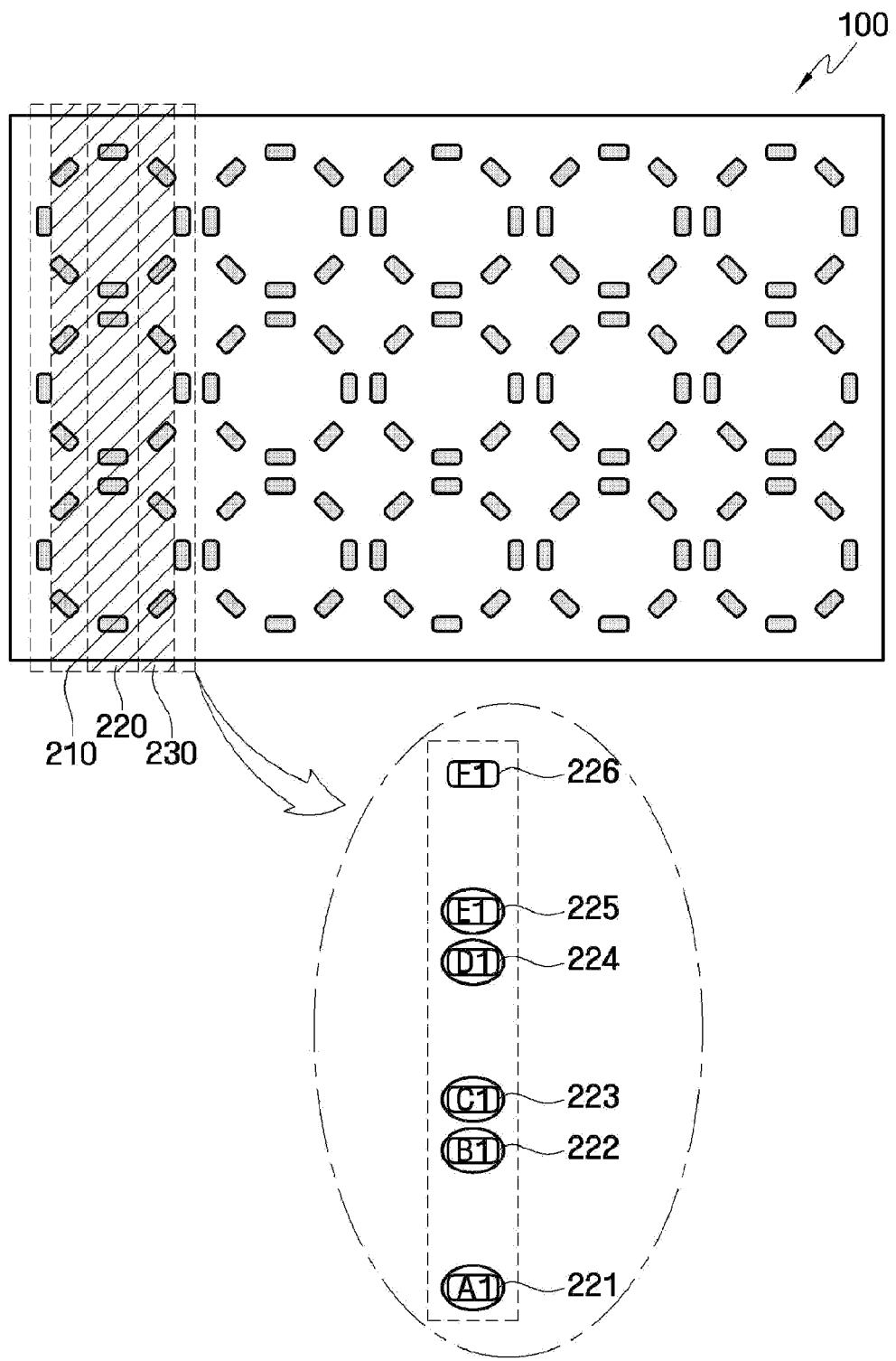

In detail, among the sectors 101, 102, 103, 104, and 105 formed by partitioning the board 100, sectors including the mounting points greater than the heads 800 are selected and are represented as the second sub-boards 210, 220 and 230. In the drawings, among the sectors 101, 102, 103, 104, and 105, the sectors 102, 103 and 104 have six (6) mounting points. Thus, in a case of using the loader 600 including five variable pitch heads 800 (FIG. 9), the sectors 102, 103 and 104 become the second sub-boards 210, 220 and 230. Among the second sub-boards 210, 220 and 230, the centrally positioned second sub-board 220 includes six mounting points 221, 222, 223, 224, 225, and 226 (FIG. 11). Any one among the above-stated plurality of pitch candidates is selected as a mounting pitch, and the selected mounting pitch is applied to the six mounting points to determine a set of first mounting points for a shortest mounting time and a mounting sequence of mounting points in the set of first mounting points. The above cycle is executed on all of the plurality of pitch candidates to finally determine the mounting sequence and the mounting pitch.

Figure 12:
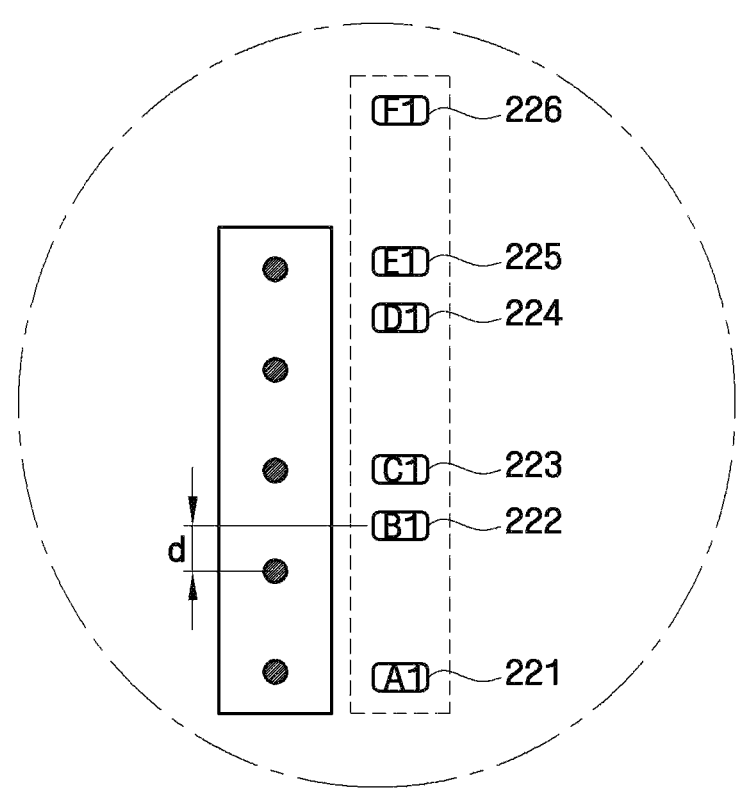
Figure 13:
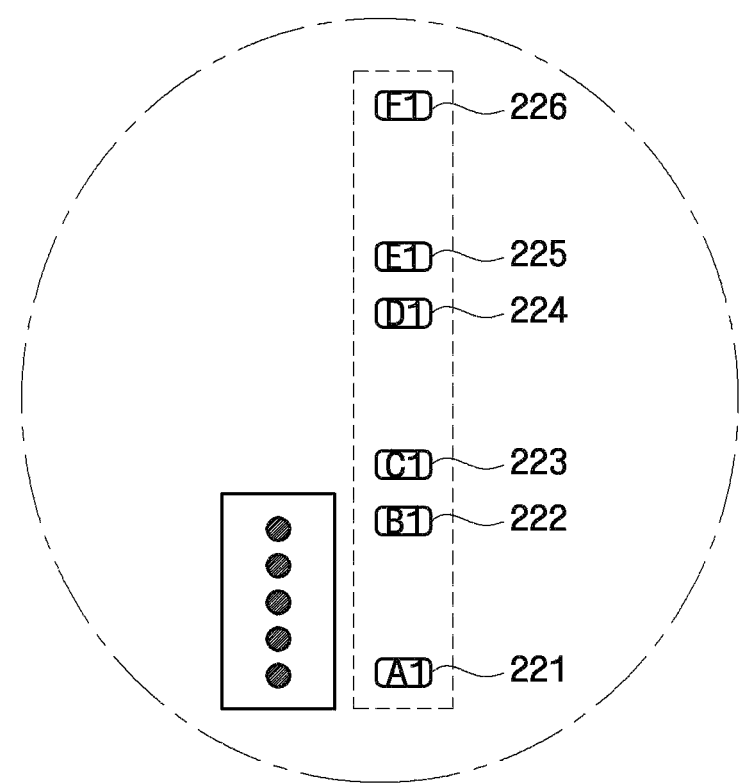

Referring to FIG. 11, six mounting points 221, 222, 223, 224, 225, and 226 in the second sub-board 220 are enlarged. A plurality of pitch candidates are applied to the six mounting points 221, 222, 223, 224, 225, and 226, thereby determining a mounting sequence and a pitch requiring a shortest mounting time. In FIG. 11, five mounting points 221, 222, 223, 224, and 225 are determined as a set of first mounting points and a mounting sequence requiring a shortest mounting time may be A1-C1-D1-B1-E1, for example. Referring to FIGS. 12 and 13, components may be mounted according to a pitch candidate corresponding to a head-to-head interval. First, as shown in FIG. 12, three mounting points are mounted at a time and the heads are moved by a distance d to then mount the components 700 or 710 at different mounting points. Alternatively, as shown in FIG. 13, one component may be mounted at a time. Therefore, in order to determine a pitch and a mounting sequence for a shortest mounting time, after each of the plurality of pitch candidates is set as a mounting pitch, and mounting point sequences for a shortest mounting time for the respective pitch candidates are determined, one among the determined mounting point sequences (10 sequences in a case where the number of pitch candidates is 10) is finally determined as the mounting point sequence requiring a shortest mounting time. At this time, the mounting pitch is also determined.

Referring to FIGS. 8, 14, 15, 16 and 19, third sub-boards 310, 320 and 330 are selected, a mounting sequence and a corresponding pitch of mounting points in first sub-boards 410, 450 and 460 derived from the third sub-boards 310, 320 and 330 are determined (S300).

In detail, sectors that are not selected as the second sub-boards among the sectors, and mounting points that are not included in the set of first mounting points in the second sub-boards are combined to form the third sub-boards 310, 320, and 330 having as many mounting points as or more mounting points than the heads 800. In detail, the third sub-boards 310, 320 and 330 are formed as follows. That is, the sectors that are not selected as the second sub-boards and sub-boards positioned at lateral sides of the sectors are combined, and the lateral sub-boards are combined as long as the number of mounting points in the sub-boards resulting from the combining exceeds the number of the heads. The combined sub-boards become third sub-boards.

Figure 14:
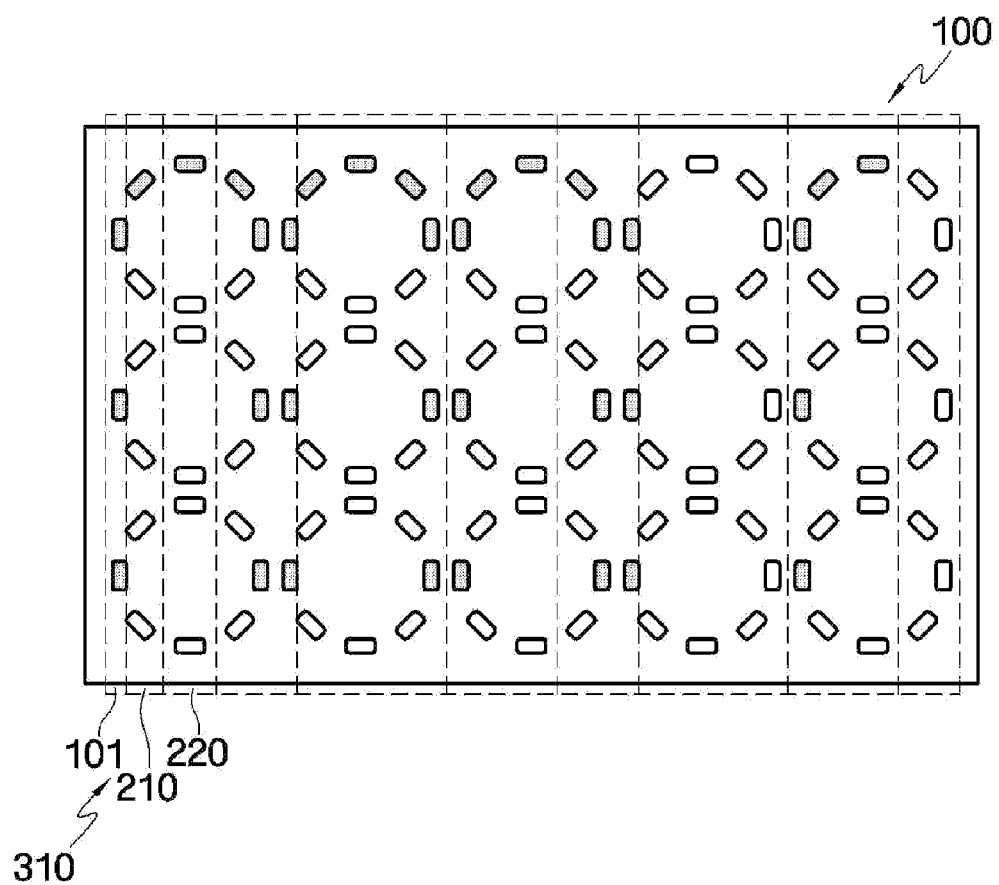

Referring to FIG. 14, the sector 101 that is not selected as the second sub-board is combined with the lateral sub-boards 210 and 220. The lateral sub-boards 210 and 220 are the second sub-boards 210 and 220, and the second sub-board 210 that is positioned right next to the sector 101 has one mounting point (shaded) that is not included in the set of first mounting points. The sector 101 that is not selected as the second sub-board even after the combining of the mounting point may have four mounting points in total. Thus, the second sub-board 220 is further combined. The second sub-board 220 has one mounting point (shaded) that is not included in the set of first mounting points. Thus, the sector that is not selected as the second sub-board even after the further combining of the mounting point may have five mounting points in total, and combining is terminated. That is to say, the third sub-board 310 is formed by the sector 101 and the second sub-boards 210 and 220.

The mounting sequence and pitch for the third sub-boards resulting from combining are determined as follows. Like in the second sub-boards 210, 220 and 230, each of the plurality of pitch candidates is applied to the mounting points in the third sub-boards resulting from combining to determine a set of second mounting points for a shortest mounting time and a mounting sequence of mounting points in the set of second mounting points.

Figure 15:
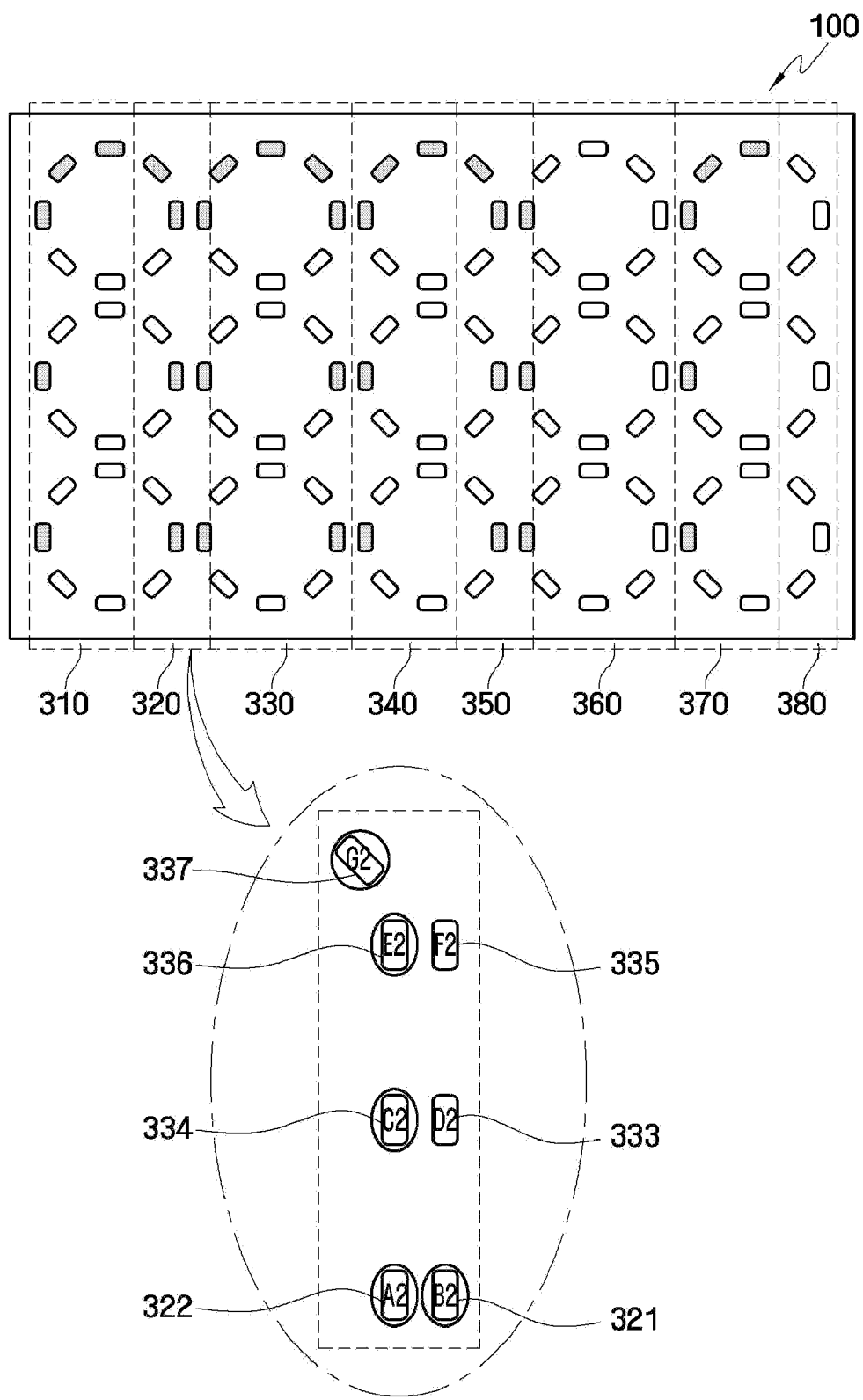
Figure 16:
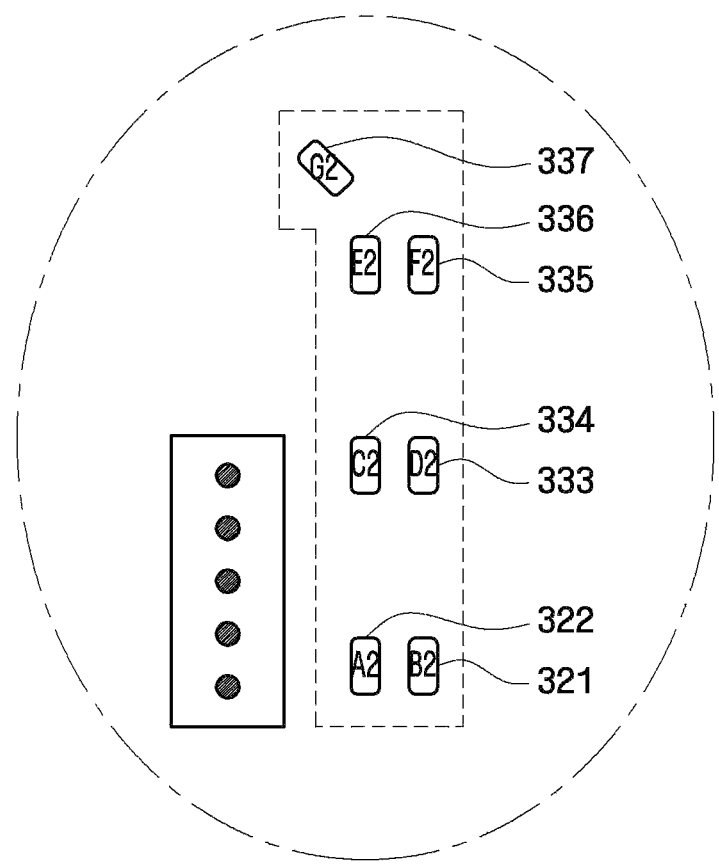

Referring to FIG. 15, there are seven mounting points 321, 322, 333, 334, 335, 336 and 337 in the third sub-board 320. Each of the plurality of pitch candidates is applied to the seven mounting points to determine as many mounting point mounting sequences as the plurality of pitch candidates, the mounting point mounting sequences requiring a shortest mounting time, and among the determined mounting point mounting sequences, a mounting point mounting sequence requiring a shortest mounting time is selected. In FIG. 15, 5 mounting points 321, 322, 323, 324, and 325 may be included in the set of second mounting points and the corresponding mounting sequence may be B2-C2-A2-G2-E2, for example. Referring to FIG. 16, the components 700 or 710 may be mounted at two mounting points 322 and 334 at a time. Alternatively, one component of the components 700 or the components 710 may be mounted at a time according to the pitch candidates corresponding to the head-to-head intervals. Therefore, in order to determine a pitch and a mounting sequence for a shortest mounting time, as described above, each of the plurality of pitch candidates is employed to finally determine one mounting point sequence and a mounting pitch for a shortest mounting time. At this time, the mounting pitch is also determined.

As described above, according to the present exemplary embodiment, all of the sectors formed by partitioning are targeted on the entire board and the illustrated board 100 is partially partitioned by dotted lines, which is, however, only for convenient illustration.

Referring to FIG. 8, in consideration of the number of mounting points in the entire board 100, it is determined whether a combining process for forming the third sub-boards is to be continued. That is, the combining process for forming the third sub-boards is repeatedly performed until there are less mounting points than the heads 800 or no more mounting points exist (S400).

Figure 17:
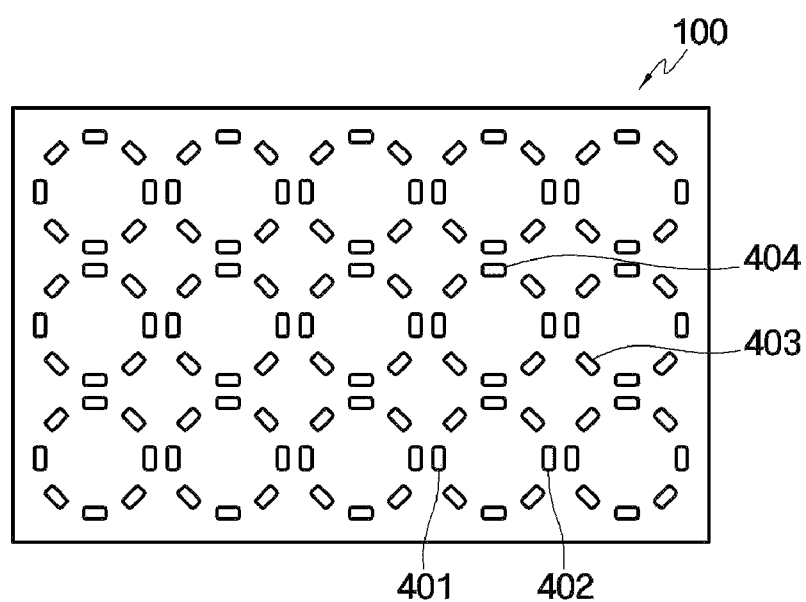
Figure 18:
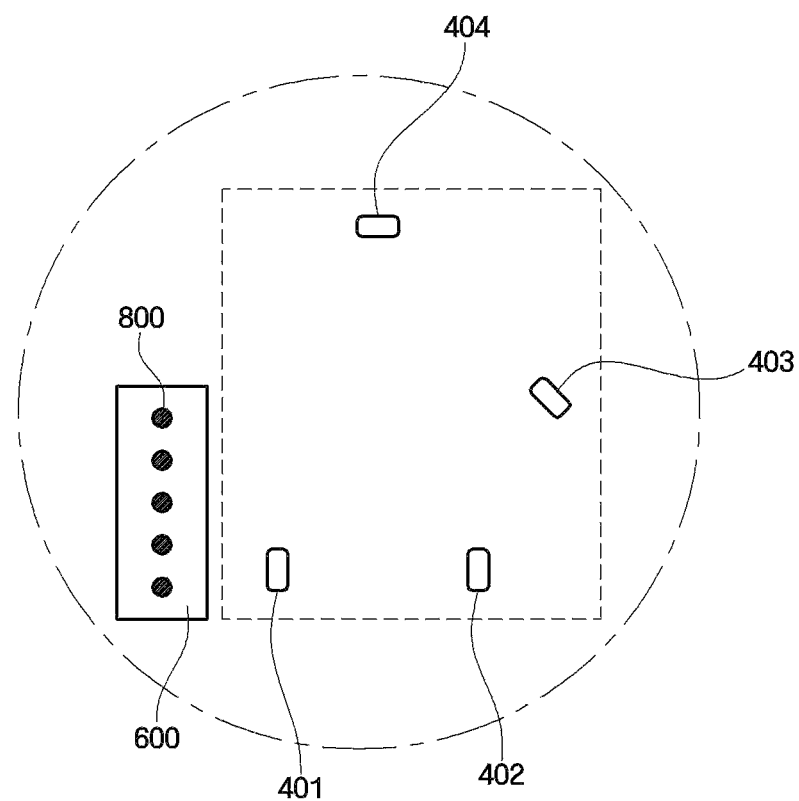

Referring to FIGS. 8, 17 and 18, when there are fourth sub-boards having mounting points less than the heads 800, corresponding mounting sequence and pitch are determined (S500).

In detail, third sub-boards 310, 320, 330, 340, 350 are repeatedly formed by combining. Thereafter, when the number of mounting points in the entire board 100 becomes smaller than that of the heads 800, the mounting sequence and corresponding pitch are determined for fourth sub-boards having such mounting points. For example, when four mounting points remain in the entire board 100, the above-stated 10 pitch candidates are applied to the mounting points 401, 402, 403 and 404 to determine a mounting sequence and a corresponding pitch for a shortest mounting time. Alternatively, the components 700 or 710 may be mounted while the loader 600 passes along the board 100 without performing the above-stated calculation process.

The above process may be skipped when there is no more mounting point remaining in the entire board 100 as the result of combining, which is because the number of all mounting points existing in the board 100 is a multiple of the number of the heads 800.

Figure 19:
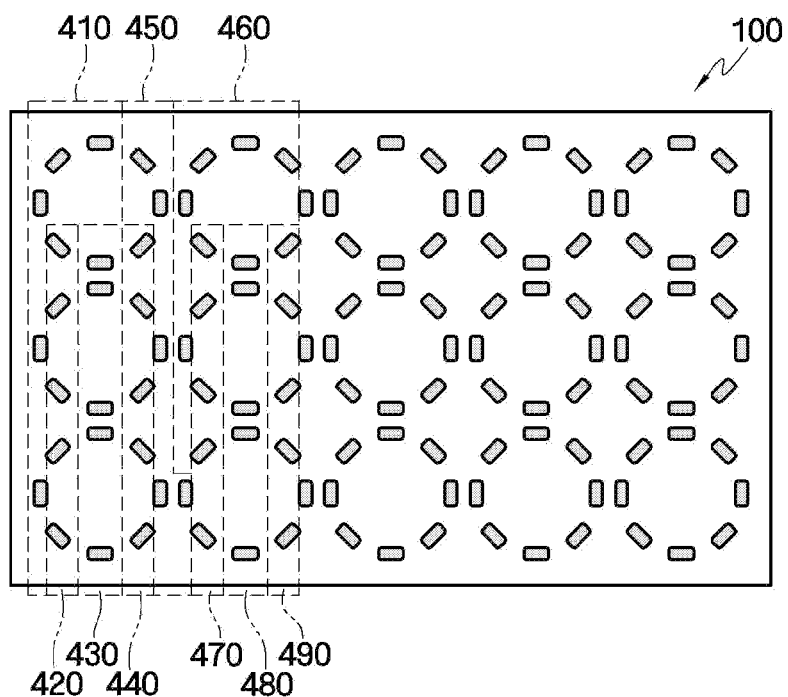

Referring to FIGS. 8 and 19, mounting sequences and corresponding pitches are determined for all of the mounting points existing in the board 100, and it is also determined whether there is a mounting point, for which a mounting sequence and a corresponding pitch are not yet determined (S600).

In detail, after a component mounting sequence and a corresponding pitch are determined in a case where the number of mounting points is smaller than that of the heads 800, that is, in the forth sub-boards, (or a mounting sequence and a corresponding pitch of all of the mounting points are determined only by combining), component mounting sequences and corresponding pitches for all of the mounting points positioned in the board 100 are determined, thereby partitioning the entire board 100 into first sub-boards. Referring to FIG. 19, each of the first sub-boards in the entire board 100 has as many mounting points as or more mounting points than the number of the heads 800, and the entire board 100 is to be partitioned into the first sub-boards, for example, 410 to 490, on each of which a cycle of mounting components is to be actually executed. In the loader 600 having five heads 800, for example, there are five mounting points in the first sub-boards 410, 420, 430, 440, 470, 480 and 490. In a case where the number of mounting points in the entire board 100 is not a multiple of the number of the heads 800, there may be the fourth sub-boards having less mounting points than the number of the heads 800. Consequently, the entire board 100 is partitioned into first the sub-boards 410 to 490, on which a cycle is to be actually executed.

Figure 20:
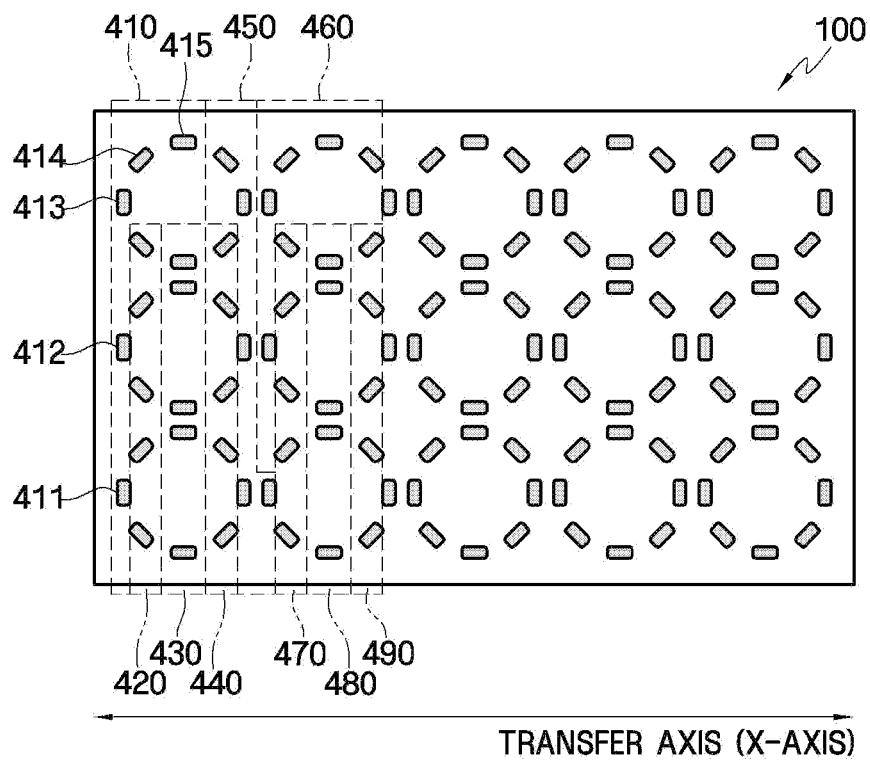

Referring to FIGS. 8 and 20, a mounting sequence among first sub-boards is determined (S700).

In detail, the first sub-boards 410 to 490 are mounted in an ascending order sequentially from the first sub-board having the smallest coordinate average of the axis (i.e., the X-axis) perpendicular to a direction in which the heads are arranged. The first sub-board 420 positioned in the second place and the first sub-board 430 positioned in the third place have a same X coordinate of mounting points belonging to each of the sub-boards 420 and 430. Therefore, the first sub-board 420 positioned in the second place is mounted earlier than the first sub-board 430 positioned in the third place. However, with regard to the first sub-board 410 positioned in the first place and the first sub-board 420 positioned in the second place, the first sub-board 410 is generally mounted earlier than the first sub-board 420. However, the first sub-board 420 may be mounted earlier than the first sub-board 410. For example, assuming that X coordinates of mounting points of the first sub-board 410 positioned in the first place are 1's for a first mounting point 411, a second mounting point 412 and a third mounting point 413, 3 for a fourth mounting point 414, and 10 for a fifth mounting point 415, X coordinates of mounting points of the first sub-board 420 positioned in the second place are all 3's. In this case, the X coordinate average of the mounting points in the first sub-board 410 is 3.2, and the X coordinate average of the mounting points in the first sub-board 420 is 3. Thus, the first sub-board 420 positioned in the second place may be mounted earlier than the first sub-board 410 positioned in the first place.

In detail, after the mounting sequence among the first sub-boards 410, 420, 430, 440, 450, 460 and 470 is determined, the mounting sequence for the mounting points positioned in each of the first sub-boards 410, 420, 430, 440, 450, 460 and 470 is determined. Since the mounting sequence for the mounting points has already been determined when the pitch is determined, the mounting points are mounted in that order.

Figure 21:
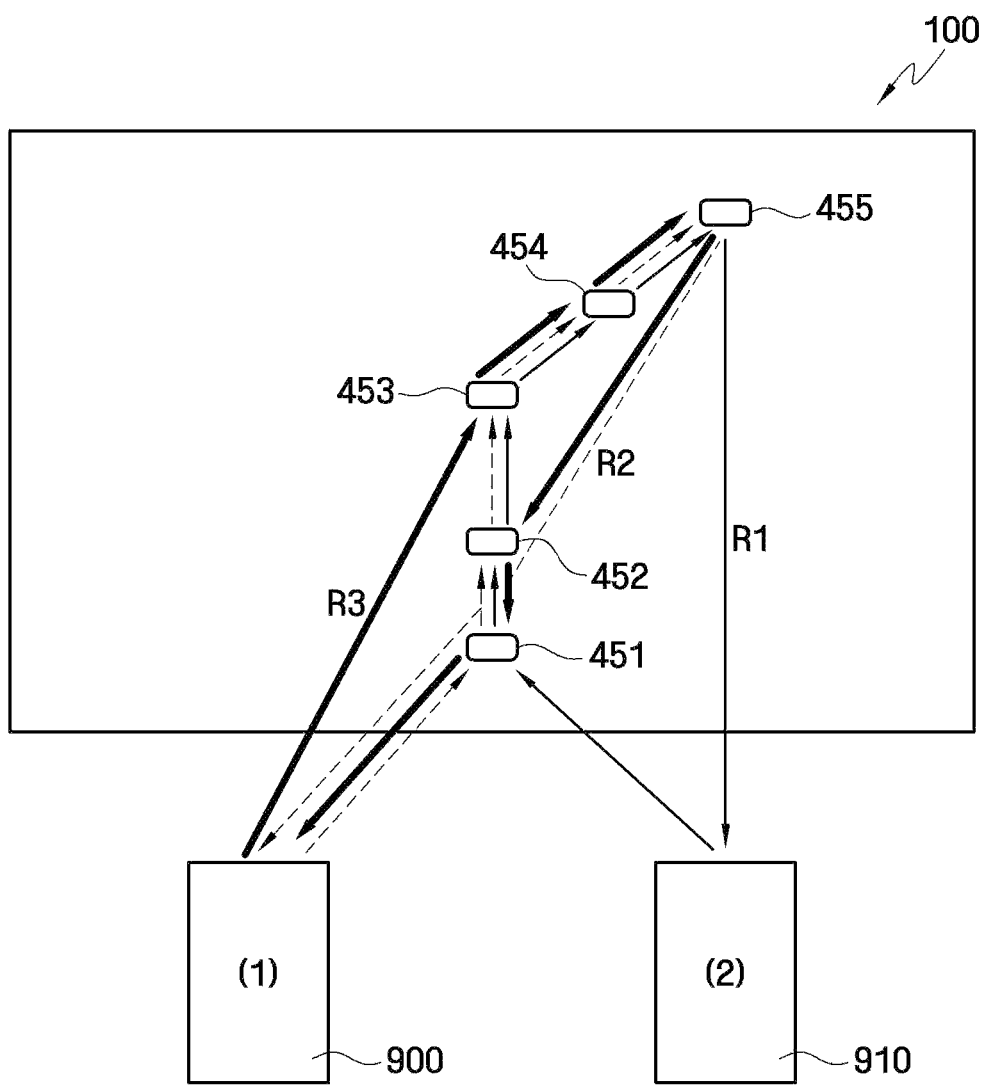

Referring to FIGS. 8 and 21, the mounting sequence among the mounting points in the first sub-boards is re-determined (S800).

In detail, while only positions of the mounting points in a sub-board are taken into consideration in determining a mounting point sequence between the mounting points stated above, not only the positions of the mounting points but also a position of the component feeder 900 are taken into consideration in this re-determining process. The re-determining process may also be applied to the first sub-boards 420 and 430 derived from the second sub-boards. However, the re-determining process may be mainly applied to the first sub-boards 410 and 460 derived from third sub-boards that cannot be simultaneously mounted because the mounting points in each of the first sub-boards 410 and 460 are irregularly distributed. (see FIG. 20).

Referring to FIG. 21, in a case where a component feeder 910 is in a position (2), a component mounting sequence is the same as the mounting route R1 in which the mounting point 451 positioned at the bottommost place of the board 100 is first mounted. However, in a case where a component feeder 910 is in a position (1), route twisting occurs to the mounting route R2 in which mounting points are mounted in the same sequence as the previous route R1, that is, in an order of mounting points 451-452-453-454-455. Therefore, the mounting points are mounted according to the mounting route R3, that is, in an order of 453-454-455-452-451, from the mounting point 453 positioned in the third place from bottom to top in view of the bottommost place of the board 100, which reduces movements, requiring a less mounting time.

Therefore, instead of a predetermined sequence of mounting the components 700 or 710, the re-determining process for determining a new mounting sequence taking a position of the component feeder 900 or 910 into consideration, is performed. Consequently, the mounting sequence of the components 700 or 710 is re-determined.

Figure 22:
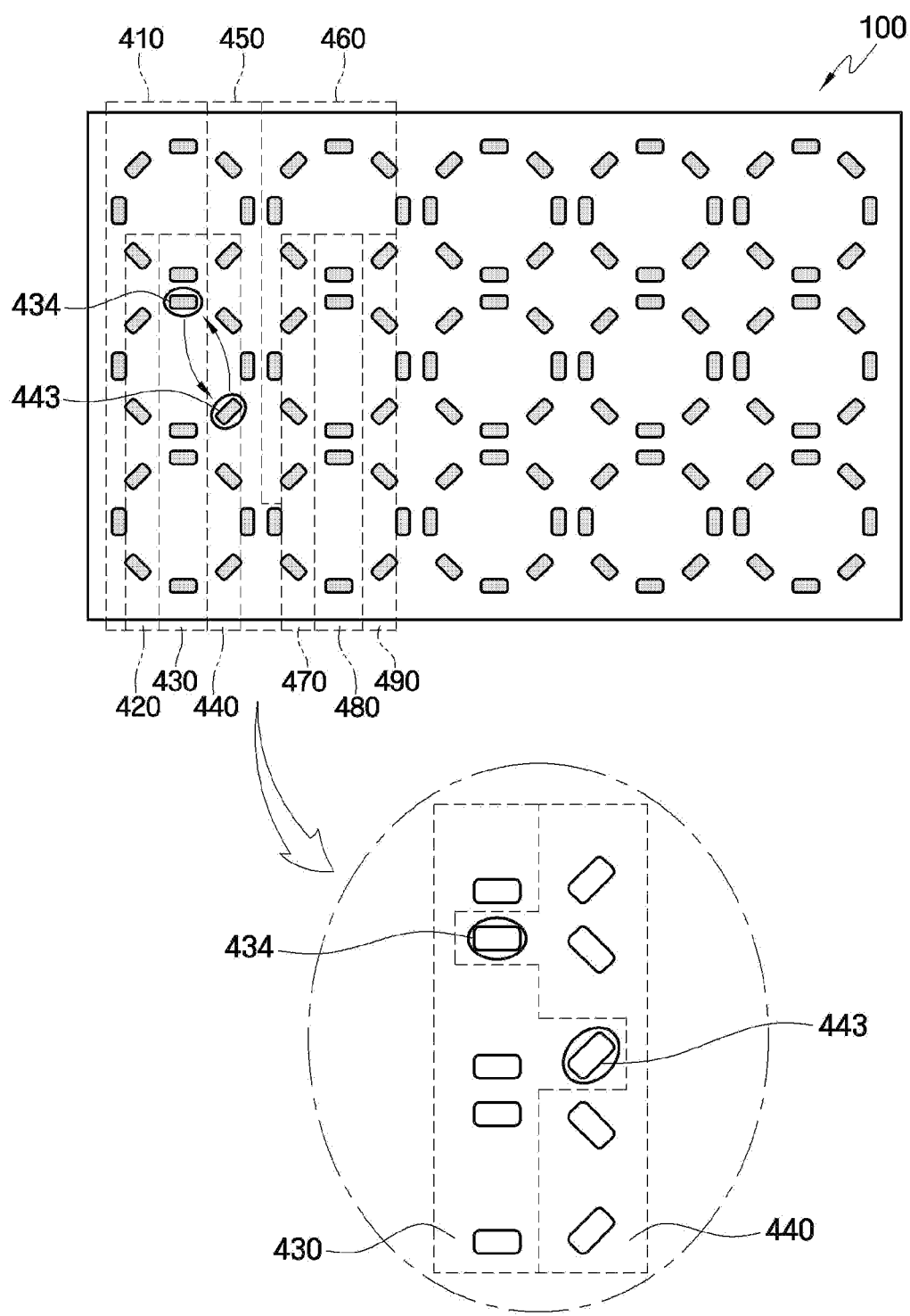

Referring to FIGS. 8 and 22, the mounting points in the first sub-boards are exchanged and the mounting sequence is then re-optimized (S900).

In detail, after the component mounting sequence for all of the mounting points positioned in the board 100 is determined through the re-determining process, the mounting points in the first sub-boards 410 to 490 are exchanged, thereby re-optimizing the mounting sequence. During the re-optimizing process, mounting points 434 and 443 may be exchanged only between the adjacent first sub-boards 430 and 440. In some cases, mounting points may be exchanged among all of the first sub-boards 410 to 490. Here, the pitch to be applied may be the preset pitch for the first sub-boards, which means that no pitch adjustment is performed. The mounting point mounting sequence for a shortest mounting time is determined simply by changing the mounting sequence of the components 700 or 710 among mounting points. As stated above, according to the present exemplary embodiment, all of the sub-boards formed by partitioning are targeted on the entire board 100 and the illustrated partition by dotted lines is, however, only for convenient illustration.

Figure 23:
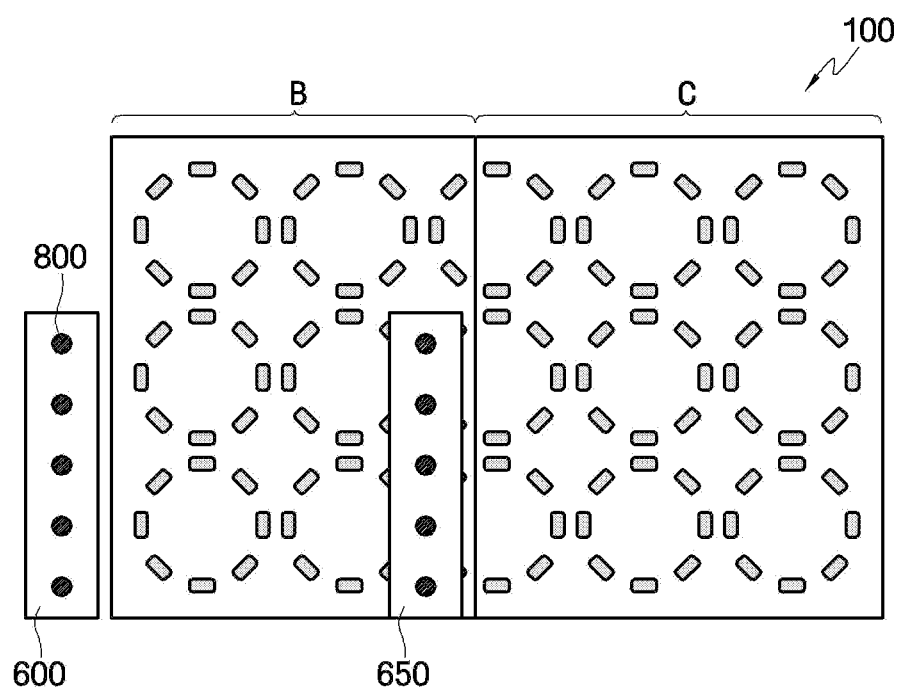
FIG. 23 is a schematic layout view illustrating that multiple loaders are arranged on a board, according to an exemplary embodiment.

FIG. 23 is a schematic layout view illustrating that multiple loaders are arranged on a board partitioned into a predetermined number of sections.

Referring to FIG. 23, two loaders 600 and 650, a set of variable pitch heads 800, are illustrated. However, the number of the loaders 600 and 650 may be variable if necessary. In a case of using multiple loaders 600 and 650, the board 100 is first partitioned as many sections as the loaders 600 and 650, and each section is subjected to determination of a mounting sequence and a corresponding pitch (see FIGS. 8 through 22), the components 700 or 710 are mounted in the corresponding sections B and C for each of the loaders 600 and 650. As shown in FIG. 23, first and second loaders 600 and 650 are arranged in the board 100. The first loader 600 mounts the section B and the second loader 650 mounts the section C. Accordingly, even when the multiple loaders 600 and 650 are used, since there are partitioned sections, the same mounting sequence of each of the respective loaders 600 and 650 is maintained from left to right during a mounting operation, thereby minimizing interference between the respective loaders 600 and 650.

In addition, the mounting sequence and the corresponding pitch are determined for the entire board 100 in the above-described manner as shown in FIGS. 8 through 22, and the board 100 is then partitioned into as many sections as the loaders 600 and 650 to then perform mounting operations in the corresponding section for each of the loaders 600 and 650.

While the inventive concept has been particularly shown and described with reference to the exemplary embodiments thereof, it will be understood by those of ordinary skill in the art that various changes in form and details may be made therein without departing from the spirit and scope of the inventive concept as defined by the following claims. It is therefore desired that the present exemplary embodiments be considered in all respects as illustrative and not restrictive, reference being made to the appended claims rather than the foregoing description to indicate the scope of the inventive concept.

What is claimed is:

1. A method of determining a sequence of mounting a plurality of components on a board by using a plurality of variable pitch heads having a plurality of pitches, the method comprising:
    partitioning the board into a plurality of sectors, each of the sectors comprising a plurality of mounting points arranged in parallel with a direction in which the heads are arranged;
    dividing the board into a plurality of sub-boards comprising first sub-boards based on the sectors, each of the first sub-boards comprising as many mounting points as the heads; and
    determining a combination of a sequence of mounting the components on the board and at least one pitch among the pitches required to mount the components on the board in a shortest time, compared to another sequence or other sequences of mounting the components on the board and another pitch or other pitches among the pitches, based on the first sub-boards.

2. The method of claim 1, wherein the determining the combination of the sequence and the at least one pitch comprises determining a first sequence between mounting points in each of the first sub-boards and a second sequence between the first sub-boards, based on characteristics of the mounting points of the first sub-boards, and
    wherein at least one of the determined first sequence and the determined second sequence is changed by having at least two of the first sub-boards exchange at least one mounting point included in each of the at least two first sub-boards.

3. The method of claim 1, wherein the pitch of the heads is adjusted based on a characteristic of each of the first sub-boards for the mounting the components.

4. The method of claim 1, wherein the determining the combination of the sequence and the pitch comprises:
selecting, from the sectors, a plurality of second sub-boards comprising as many mounting points as or more mounting points than the heads;
applying the plurality of pitches to mounting points in each of the second sub-boards and determining a combination of a set of first mounting points, a sequence of the first mounting points for mounting on the first mounting points and a pitch, required to mount a corresponding number of the components on the each of the second sub-boards in a shortest time, compared to another set or other sets of the mounting points in the each of the second sub-boards, another sequence or other sequences for mounting on the each of the second sub-boards and another pitch or other pitches among the plurality of pitches; and
designating an area in the each of the second sub-boards comprising the set of the first mounting points as one of the first sub-boards.

5. The method of claim 4, further comprising:
forming at least one third sub-board comprising sectors not selected to comprise the second sub-boards and at least one mounting point not included in the determined set of the first mounting points so that the at least one third sub-board comprises as many mounting points as or more mounting points than the heads;
applying the plurality of pitches to mounting points in each of the at least one third sub-board and determining a combination of a set of second mounting points, a sequence of the second mounting points for mounting on the second mounting points and a pitch, required to mount a corresponding number of the components on the each of the at least one third sub-board in a shortest time, compared to another set or other sets of mounting points in the each of the at least one third sub-board, another sequence or other sequences of mounting on the at least one third sub-board and another or other pitches among the plurality of pitches;
designating an area in the each of the at least one third sub-board comprising the set of the second mounting points as another one of the first sub-boards; and
iterating the forming at least one of the third sub-board, the applying the plurality of pitches and the designating the area of the each of the at least one third sub-board until the board has no more mounting points than a number of the heads.

6. The method of claim 5, further comprising:
after the iterating, forming a fourth sub-board comprising mounting points of which a number is less than the number of the heads;
determining a combination of a sequence of the mounting points for mounting on the fourth sub-board and a pitch, required to mount a corresponding number of the components on the fourth sub-board in a shortest time, compared to another sequence or other sequences for mounting on the fourth sub-board and another or other pitches among the plurality of pitches.

7. The method of claim 1, wherein an axis parallel with the direction in which the heads are arranged is Y-axis, and the plurality of pitches comprise:

a Y offset value which is a distance between two mounting points included in two adjacent arrays having a same pattern of the mounting points;
1/n of the Y offset value;
a median of Y coordinate differences between the mounting points within a sector;
an average of Y coordinate differences between the mounting points within the sector;
a most frequent value of Y coordinate differences between the mounting points within the sector;
a preset minimum pitch of the heads; and
a preset maximum pitch of the heads.

8. The method of claim 7, wherein the determining the combination of the sequence and the at least one pitch based on the first sub-boards comprises determining a sequence between the first sub-boards for mounting the components such that the first sub-boards are mounted sequentially from a first sub-board having a smallest coordinate average of an axis perpendicular to the Y-axis.

9. The method of claim 8, wherein the determining the combination of the sequence and the at least one pitch based on the first sub-boards comprises determining a sequence of mounting the components on mounting points within each of the first sub-boards at the same time with determining a pitch of the at least one pitch among the pitches to be used for mounting the components on the each of the first sub-boards.

10. The method of claim 9, wherein the determining the sequence of mounting the components on the mounting points included in the each of the first sub-boards further comprises re-determining the sequence, according a position of a component feeder in which the components are provided to be adsorbed by the heads.

11. The method of claim 10, wherein the determining the sequence of mounting the components on the mounting points within the each of the first sub-boards further comprises changing the sequence of mounting the components on the mounting points included in the each of the first sub-boards by having at least two of the first sub-boards exchange at least one mounting point included in each of the at least two first sub-boards, and
wherein the pitch determined for mounting the components on the each of the first sub-boards is used for the changed sequence of mounting the components.

12. The method of claim 1, further comprising adsorbing simultaneously as many components of the components as the heads by taking into consideration a distance between the components provided in a component feeder and adjusting a pitch for each of the components.

13. The method of claim 1, wherein the board is one of sections constituting an entire board, and the heads are provided in a loader of a plurality of loaders,
wherein the partitioning, the dividing and the determining are performed respectively on each of the other sections of the entire board using a corresponding loader.

14. A device for mounting a plurality of components on a board, the device comprising:
a loader comprising a plurality of variable pitch heads having a plurality of pitches; and
a controller which:
partitions the board into a plurality of sectors, each of the sectors comprising a plurality of mounting points arranged in parallel with a direction in which the heads are arranged;
divides the board into a plurality of sub-boards comprising first sub-boards based on the sectors, each of the first sub-boards comprising as many mounting points as the heads; and determines a combination of a sequence of mounting the components on the board and at least one pitch among the pitches required to mount the components on the board in a shortest time, compared to another sequence or other sequences of mounting the components on the board and another pitch or other pitches among the pitches, based on the first sub-boards.

15. The device of claim 14, wherein the controller determines the combination of the sequence and the at least one pitch based on the first sub-boards by determining a first sequence between mounting points in each of the first sub-boards and a second sequence between the first sub-boards, based on characteristics of the mounting points of the first sub-boards, and wherein the controller changes at least one of the determined first sequence and the determined second sequence by having at least two of the first sub-boards exchange at least one mounting point included in each of the at least two first sub-boards.

16. The device of claim 14, wherein the controller adjusts the pitch of the heads based on a characteristic of each of the first sub-boards for the mounting the components.

17. The device of claim 14, wherein the controller determines the combination of the sequence and the at least one pitch based on the first sub-boards by:

selecting, from the sectors, a plurality of second sub-boards comprising as many mounting points as or more mounting points than the heads;

applying the plurality of pitches to mounting points in each of the second sub-boards and determining a combination of a set of first mounting points, a sequence of the first mounting points for mounting on the first mounting points and a pitch, required to mount a corresponding number of the components on the each of the second sub-boards in a shortest time, compared to another set or other sets of the mounting points in the each of the second sub-boards, another sequence or other sequences for mounting on the each of the second sub-boards and another pitch or other pitches among the plurality of pitches; and designating an area in the each of the second sub-boards comprising the set of the first mounting points as one of the first sub-boards.

18. The device of claim 17, wherein the controller determines the combination of the sequence and the at least one pitch based on the first sub-boards further by:

forming at least one third sub-board comprising sectors not selected to comprise the second sub-boards and at least one mounting point not included in the determined set of the first mounting points so that the at least one third sub-board comprises as many mounting points as or more mounting points than the heads;

applying the plurality of pitches to mounting points in each of the at least one third sub-board and determining a combination of a set of second mounting points, a sequence of the second mounting points for mounting on the second mounting points and a pitch, required to mount a corresponding number of the components on the each of the at least one third sub-board in a shortest time, compared to another set or other sets of mounting points in the each of the at least one third sub-board, another sequence or other sequences of mounting on the at least one third sub-board and another or other pitches among the plurality of pitches;

designating an area in the each of the at least one third sub-board comprising the set of the second mounting points as another one of the first sub-boards; and iterating the forming at least one of the third sub-board, the applying the plurality of pitches and the designating the area of the each of the at least one third sub-board until the board has no more mounting points than a number of the heads.

19. The device of claim 18, after the iterating, the controller further:

forms a fourth sub-board comprising mounting points of which a number is less than the number of the heads;

determines a combination of a sequence of the mounting points for mounting on the fourth sub-board and a pitch, required to mount a corresponding number of the components on the fourth sub-board in a shortest time, compared to another sequence or other sequences for mounting on the fourth sub-board and another or other pitches among the plurality of pitches.

20. The device of claim 14, wherein an axis parallel with the direction in which the heads are arranged is Y-axis, and the plurality of pitches comprise:

a Y offset value which is a distance between two mounting points included in two adjacent arrays having a same pattern of the mounting points;

1/n of the Y offset value;

a median of Y coordinate differences between the mounting points within a sector;

an average of Y coordinate differences between the mounting points within the sector;

a most frequent value of Y coordinate differences between the mounting points within the sector;

a preset minimum pitch of the heads; and a preset maximum pitch of the heads.

21. The device of claim 20, wherein the controller determines the combination of the sequence and the pitch by determining a sequence between the first sub-boards for mounting the components such that the first sub-boards are mounted sequentially from a first sub-board having a smallest coordinate average of an axis perpendicular to the Y-axis.

22. The device of claim 21, wherein the controller determines the combination of the sequence and the at least one pitch based on the first sub-boards further by determining a sequence of mounting the components on mounting points within each of the first sub-boards at the same time with determining a pitch of the at least one pitch among the pitches to be used for mounting the components on the each of the first sub-boards.

23. The device of claim 22, wherein the controller re-determines the sequence of mounting the components on the mounting points included in the each of the first sub-boards according to a position of a component feeder in which the components are provided to be adsorbed by the heads.

24. The device of claim 14, wherein the controller re-determines the sequence of mounting the components on the mounting points included in the each of the first sub-boards by changing the sequence of mounting the components on the mounting points included in the each of the first sub-boards by having at least two of the first sub-boards exchange at least one mounting point included in each of the at least two first sub-boards, and wherein the pitch determined for mounting the components on the each of the first sub-boards is used for the changed sequence of mounting the components.

25. The device of claim 14, wherein the controller adsorbs simultaneously as many components of the components as the heads by taking into consideration a distance between the components provided in a component feeder and adjusting a pitch for each of the components.

26. The device of claim 14, further comprising at least one additional loader which comprises a plurality of variable pitch heads having a plurality of pitches, wherein the board is one of sections constituting an entire board, and wherein the controller performs the partitioning the board, the dividing the board and the determining the combination of the sequence and the at least one pitch based on the first sub-boards on each of the other sections of the entire board using a corresponding loader.

\* \* \* \* \*